(12) United States Patent
Kemmochi et al.

(10) Patent No.: US 6,641,663 B2
(45) Date of Patent: Nov. 4, 2003

(54) SILICA CRUCIBLE WITH INNER LAYER CRYSTALLIZER AND METHOD

(75) Inventors: Katsuhiko Kemmochi, Vancouver, WA (US); Robert Mosier, Vancouver, WA (US); Paul Spencer, Stevenson, WA (US)

(73) Assignee: Heracus Shin-Estu America, Camas, WA (US)

( * ) Notice: Subject to any disclaimer, the term of this patent is extended or adjusted under 35 U.S.C. 154(b) by 42 days.

(21) Appl. No.: 10/021,631

(22) Filed: Dec. 12, 2001

(65) Prior Publication Data
US 2003/0106491 A1 Jun. 12, 2003

(51) Int. Cl.$^7$ ................................................ C30B 35/00
(52) U.S. Cl. .................. 117/200; 65/3.2; 65/59.5; 65/60.1; 65/60.5; 65/63; 65/DIG. 8; 117/900
(58) Field of Search ............ 65/3.2, 59.5, 60.1, 65/60.5, 63, DIG. 8; 117/2, 200, 900

(56) References Cited

U.S. PATENT DOCUMENTS

| | | |
|---|---|---|
| 4,637,571 A | 1/1987 | Holder et al. |
| 4,935,046 A | 6/1990 | Uchikawa et al. |
| 4,956,208 A | 9/1990 | Uchikawa et al. |
| 5,885,071 A | 3/1999 | Watanabe et al. |
| 5,976,247 A | 11/1999 | Hansen et al. |
| 5,980,629 A | 11/1999 | Hansen et al. |
| 6,319,313 B1 | 11/2001 | Phillips et al. |
| 6,350,312 B1 | 2/2002 | Phillips et al. |
| 6,461,427 B2 | 10/2002 | Phillips et al. |
| 2001/0032580 A1 | 10/2001 | Phillips et al. |
| 2002/0086119 A1 | 7/2002 | Hariharan et al. |

FOREIGN PATENT DOCUMENTS

| | | |
|---|---|---|
| JP | 1126238 | 5/1989 |
| JP | 6219768 | 8/1994 |
| JP | H8-2932 | 1/1996 |
| JP | 8040737 | 2/1996 |
| JP | 09-255476 | 9/1997 |
| JP | 2000-247778 | 9/2000 |
| WO | 00/55394 | 9/2000 |
| WO | 00/55395 | 9/2000 |
| WO | 02/40732 A1 | 5/2002 |

*Primary Examiner*—Felisa Hiteshew
(74) *Attorney, Agent, or Firm*—Marger Johnson & McCollom, PC

(57) ABSTRACT

A silica glass crucible is disclosed comprising a barium-doped inner wall layer. The crucible is made by introducing into a rotating crucible mold bulk silica grain to form a bulky wall. After heating the interior of the mold to fuse the bulk silica grains, an inner silica grain, doped with barium, is introduced. The heat at least partially melts the inner silica grain, allowing it to fuse to the wall to form an inner layer. The inner layer of the crucible crystallizes when used in a CZ process, extending the operating life of the crucible.

37 Claims, 4 Drawing Sheets

SILICA CRUCIBLE WITH INNER LAYER CRYSTALLIZER AND METHOD

BACKGROUND OF THE INVENTION

The present invention is related to the field of silica crucibles, and more specifically to a silica crucible having a multi-layer wall in which one or more of the wall layers are doped with barium.

The Czochralski (CZ) process is well-known in the art for production of ingots of single crystalline silicon, from which silicon wafers are made for use in the semiconductor industry.

In a CZ process, metallic silicon is charged in a silica glass crucible housed within a susceptor. The charge is then heated by a heater surrounding the susceptor to melt the charged silicon. A single silicon crystal is pulled from the silicon melt at or near the melting temperature of silicon.

A current trend in the semiconductor industry is toward large diameter wafers, e.g., 300–400 mm in diameter. As a result, the CZ process operating period must be concomitantly increased, sometimes to more than one hundred hours. Also, structural defects in the silicon crystal can be reduced by slowing down the pulling rate, which in turn prolongs the CZ run time and emphasizes the need to improve the useful life of the crucible.

At operating temperatures, the inner surface of a silica crucible frequently reacts with the silicon melt. In many cases, the inner surface of the crucible undergoes a change in morphology. The inner surface of a crucible is seen to roughen during prolonged operation in a CZ run. This roughening, and the phase transformation underlying it, are addressed in greater detail below.

This roughening can cause a loss of crystal structure of the pulled ingot. Inner surface roughening renders the crucible unfit for use in silicon ingot manufacture. When a major portion of the inner surface of the crucible is covered by a rough surface, crystalline structure is disrupted at the crystal-melt interface. Such a roughened crucible is unsuitable for ingot manufacture and silicon crystal pulling using a roughened crucible must be ceased to avoid manufacture of substandard ingots.

Additionally, the inner surface of a silica glass crucible can partially dissolve into the silicon melt during the CZ process. Silicon and oxygen, the main components of a silica crucible, are not deleterious to the silicon melt. However, impurities in the inner layer of the crucible can be transferred to the silicon melt during this process. The quality of the pulled single crystal may be ruined, depending on the extent of contamination and the nature of the contaminant.

One such effort to control inner surface morphology is a crucible with barium-containing chemicals coated onto the inner surface. U.S. Pat. Nos. 5,976,247 and 5,980,629, both to Hansen et al., disclose a crucible incorporating a devitrification promoter on the inner surface of the crucible. The devitrification promoter is taught to prevent particulate generation at the silica-melt interface. The devitrified layer, created during a CZ run, is described in these references as a crystallized silica layer and is reported to dissolve uniformly and maintain a smooth crucible inner surface.

Barium carbonate ($BaCO_3$) is disclosed as a preferred coating material, although other alkaline-earth metal compounds are disclosed. Coating is done as a post-treatment of a finished crucible by applying a solution of barium-containing chemicals. The coated crucible is then dried using clean, hot air.

If the crystalline layer thickness exceeds a certain level, the crucible is prone to cracks and possible leakage of the silicon melt. Despite careful optimization of the barium coating level, the crucible nevertheless occasionally experiences cracking toward the end of a CZ run.

However, devitrification (i.e., crystallization) occurs in a shallow layer on the inner surface of the crucible. The silica glass so coated experiences a large volume change as it crystallizes when barium coating is used as a crystallization promoter. The volume change creates stress at the glassy phase-crystalline phase interfaces. Such stress is relieved by micro-scale deformation in the glassy phase of the crucible.

Other drawbacks to barium coating include difficulty in controlling the thickness and uniformity of barium per unit area on the crucible surface. The drying procedure is also prone to introduce airborne contamination.

Additionally, $BaCO_3$ is poorly soluble in water, but the coating can be easily removed by rinsing or wiping the inner surface with water. Normal cleaning procedures (e.g., rinsing, etching or wiping) cannot be performed after barium coating. Crucibles must also be carefully stored until used.

One of the present inventors filed Japanese Patent 3100836 (laid open Tokukai Hei8-2932), which teaches an inner layer of 0.5–1 mm in thickness and containing from 0.1–2% aluminum by weight. The inner layer crystallizes during the CZ process, such that inner surface dissolution is suppressed and the dimensional stability of the crucible is improved.

However, aluminum may dissolve into the silicon melt and subsequently lodge in the silicon crystal. The level of aluminum contamination of the crystal can be successfully controlled in some cases. Nevertheless, there are applications wherein aluminum contamination is undesirable.

SUMMARY

The present disclosure provides a silica glass crucible comprising a wall with a barium-doped layer formed as an integral part of the crucible. The inner layer is doped with barium at a concentration such that the inner layer will rapidly crystallize upon heating. Utilization of a doped layer, rather than a coating on the interior surface, permits the crucible to be handled and processed without damage to the barium-doped inner layer.

A method is disclosed for making a silica crucible having an inner layer doped so as to devitrify during a CZ run. The method comprises introducing into a rotating crucible mold bulk silica grain, consisting essentially of quartz grain, to form a bulky wall. After heating the interior of the mold to fuse the bulk silica grains, an inner silica grain, doped with barium, is introduced into the mold. The heat also at least partially melts the inner silica grain, allowing it to fuse to the wall to form an inner layer. The crucible thus formed is cooled then taken out of the mold.

The invention will become more readily apparent from the following detailed description, which proceeds with reference to the drawings, in which:

DETAILED DESCRIPTION OF EMBODIMENT(S)

Figure 1:
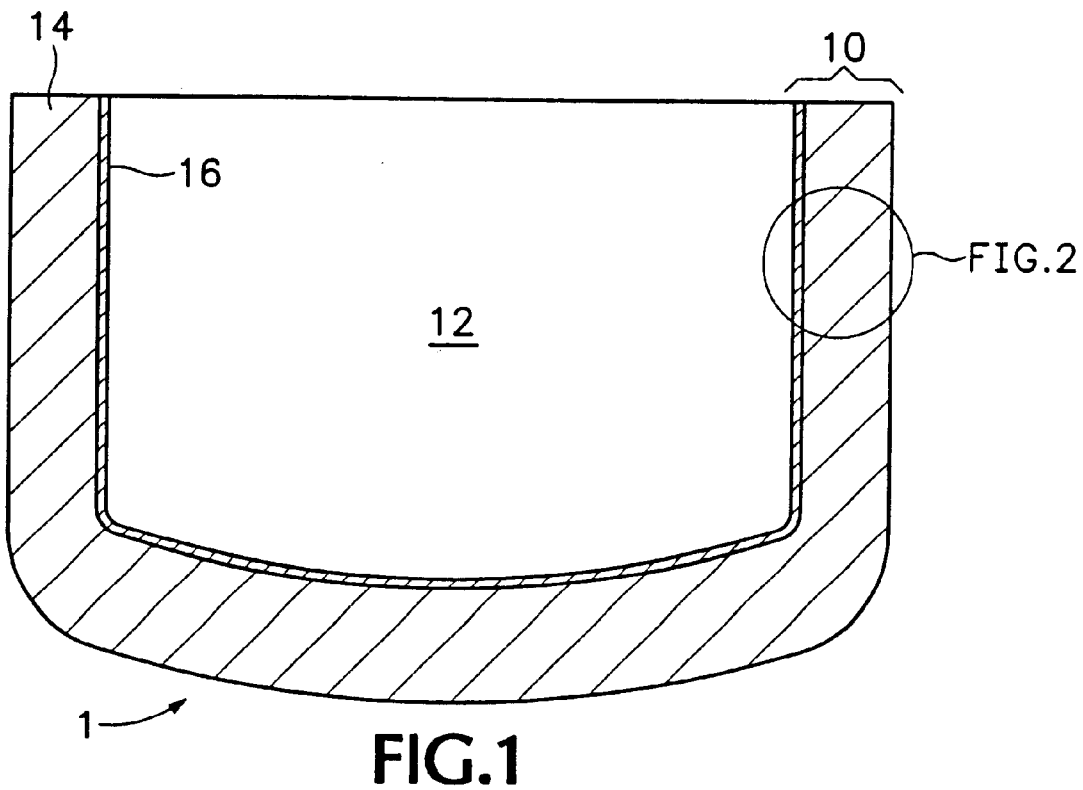
FIG. 1 is a cross-sectional view of one embodiment of a silica glass crucible constructed according to the present disclosure.
Figures 2, 3, 4:
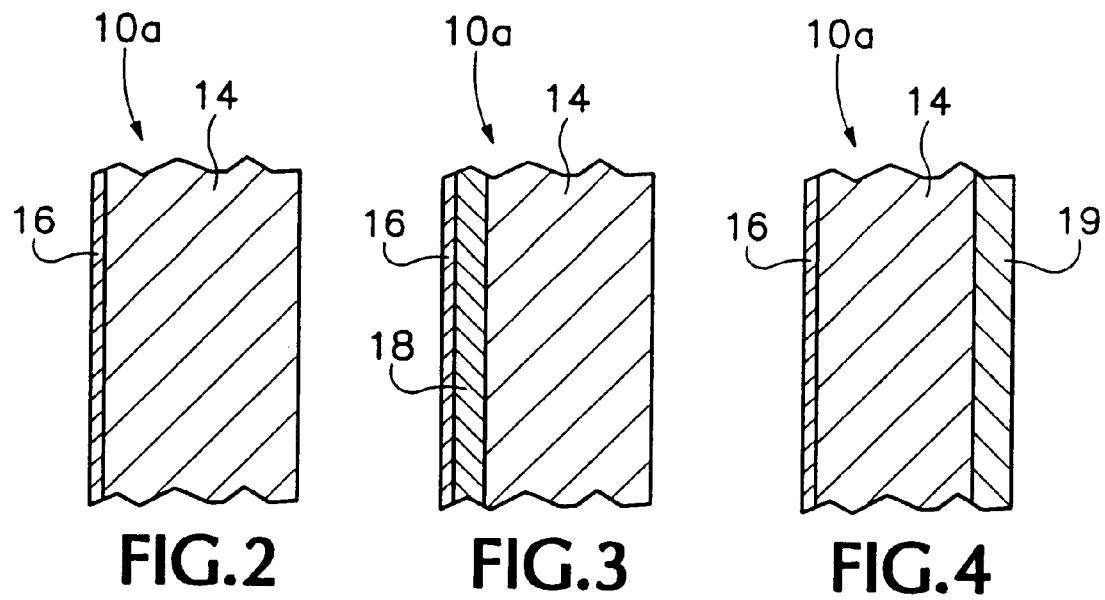
FIG. 2 is an enlarged, partial cross-sectional view of the wall of the silica glass crucible shown in FIG. 1.
FIG. 3 is an enlarged, partial cross-sectional view of the wall of a second embodiment of a silica glass crucible constructed according to the present disclosure.
FIG. 4 is an enlarged, partial cross-sectional view of the wall of a third embodiment of a silica glass crucible constructed according to the present disclosure.

In more detail, the present disclosure provides a silica glass crucible suitable for use in a CZ process. One embodiment of the crucible is shown in FIGS. 1–2. A silica glass crucible 1 has a wall 10 defining an interior cavity 12. The wall 10 comprises a side portion 10a and bottom portion.

The side portion 10a of this embodiment comprises a bulk layer 14 of pure silica and an inner layer 16 formed on the inner portion of the wall. The bulk layer 14 generally is a translucent glass layer consisting essentially of silica. The inner layer 16 is comprised of fused doped silica.

The inner layer 16 in the embodiment of FIGS. 1–2 is doped with barium in the range of 5–150 ppm, and preferably 15–75 ppm. In the illustrated embodiment, the inner layer has a thickness in the range of 0.2 mm–1.0 mm.

In other embodiments, a thin barium-doped layer can be formed on a transition layer of synthetic silica glass or pure silica glass, the latter made from purified natural quartz. Such an embodiment is shown in an enlarged cross-sectional view in FIG. 3. The side portion 10a of this embodiment comprises a bulk layer 14, an inner layer 16, and a transition layer 18. As in the embodiment of FIGS. 1–2, the bulk layer 14 is typically translucent silica glass, and the inner layer 16 likewise is doped with barium element as described below.

The transition layer 18 can be non-doped silica glass, made from natural or synthetic silica grain. Alternatively, however, various materials can be employed in the transition layer. For example, the transition layer can be a doped layer. The dopant can be an element the same or different than that used in the inner layer.

In the alternative embodiment of the crucible shown in FIG. 4, a doped layer is also formed on the outer portion of the wall 19. In one embodiment, the outer layer 19 is approximately 0.5–2.5 mm in thickness and can be doped with aluminum in the range of about 50–500 ppm. In another embodiment, the outer layer is doped with aluminum in the range of about 100–500 ppm.

In a representative crucible, the side portion 10a has a thickness of approximately 10.0 mm, of which the inner layer 16 comprises 0.2–1.0 mm, the outer layer 19 comprises 0.5–2.5 mm, and the bulk layer 14 comprises the remaining 6.5–9.4 mm.

The bottom portion can be constructed so as to have a similar structure to the side portion 10a of FIGS. 2–4, but is preferably formed without a doped outer layer.

It should be apparent that a crucible can be constructed having an inner layer 16, a transition layer 18, a bulk layer 14, and an outer layer 19.

Figure 5:
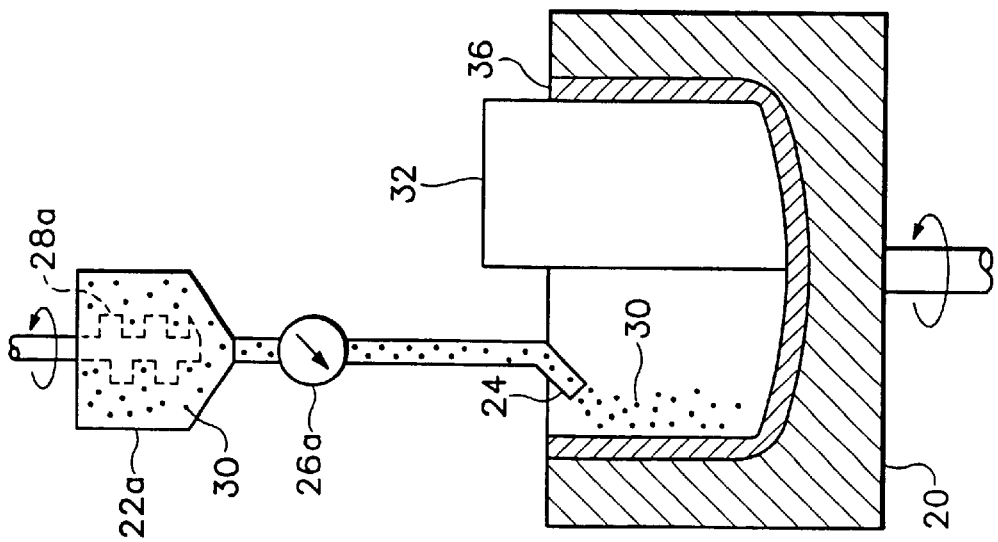

A method is disclosed herein for making a doped inner layer adapted to devitrify during a CZ run. The method shown in FIGS. 5–6 is for making the crucible embodiment shown in FIGS. 1–2.

To form the bulk grain layer 36, the bulk grain hopper 22a, flow regulating valve 26a and feed tube 24 are used. In FIG. 5, bulk silica grain 30 is introduced into a mold 20 to form the bulk grain layer 36. The bulk silica grain 30 is preferably pure quartz grain. Hopper stirring blade 28a aids the uniform flow of grain from the hopper 22a.

A scraper 32 shaped to conform to the inner surface of the mold, is generally used to shape the introduced bulk silica grain. In this manner, the bulk grain layer 36 can be formed to a selected thickness.

Figure 6:
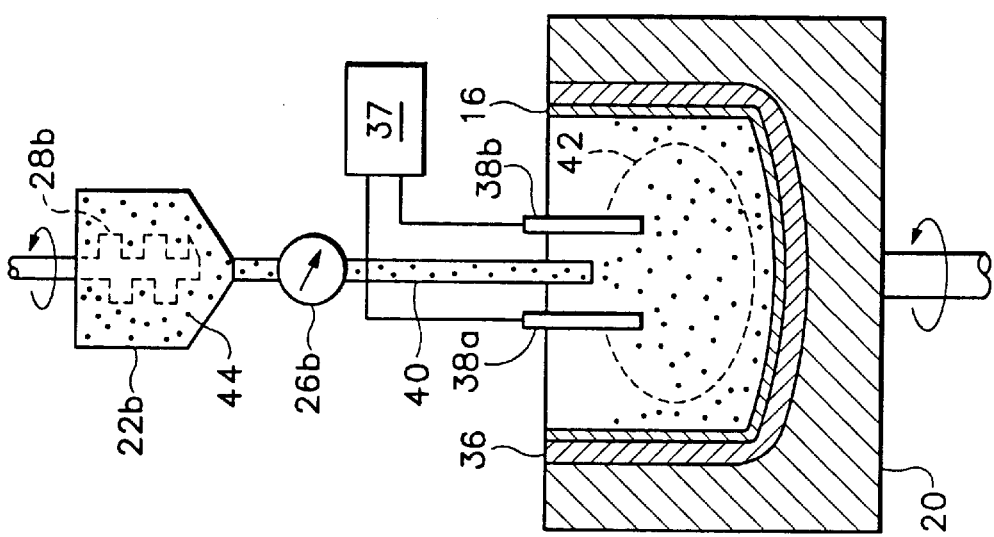
FIGS. 5–6 are diagrams showing a method for making the silica glass crucible shown in FIGS. 1–2.

Fusion of formed silica grain is shown in FIG. 6. An electrode assembly, comprising a power source 37 and electrodes 38a,38b, is positioned partially within the interior cavity of the rotating mold 20. An electric arc is produced between electrodes 38a,38b by supplying 250–350V and approximately 1800A direct current. A region of heat 42 is thereby generated within the mold interior. This heat 42 serves to fuse formed bulk grain layer 36 in the mold.

Fusion proceeds through the formed grain from proximal to distal, relative to electrodes 38a,38b. The mechanism of progressive fusion through the silica grain layer according to this technique is known to those skilled in the art, for example, as disclosed in U.S. Pat. Nos. 4,935,046 and 4,956,208 both to Uchikawa et al.

Contemporaneous with fusion of the surface of the formed bulk grain layer 36, inner silica grain 44 is poured from the inner silica grain hopper 22b through feed tube 40. Inner grain flow regulating valve 26b can be utilized to control the rate at which inner layer grain 44 is introduced into the region of heat 42. Hopper stirring blade 28b also aids the homogeneity and uniform flow of grain from the hopper 22b.

The arc produced between the electrodes creates a very strong plasma field, propelling the partially melted inner silica grain 44 outward, enabling it to be deposited on the sides and bottom of the crucible inner surface. The inner grain 44 passes through the heated region 42, is at least partially melted by the arc flame therein, and is deposited on the surface of the bulk layer, which is the fused bulk grain layer 36.

The introduced inner grain 44 is fused to the bulk layer to form an inner layer 16. Molten inner grain thereby is continuously deposited and fused over a period of time of inner layer formation. The inner layer 16 thus formed is essentially transparent and bubble-free. The thickness of fused inner layer is controlled by the introduction rate of inner silica grain and by the period of inner grain supply during fusion.

Inner silica grain 44 consists essentially of pure silica grain, such as natural silica grain washed to remove contaminants, doped with barium. Alternatively, synthetic silica grain doped with barium can be used.

In FIG. 6, the bulk layer is numbered as 36 representing bulk grain layer for convenience. At this stage in the method, of course, this layer is actually a dynamic combination of fused bulk layer 14 and unfused bulk grain layer 36.

Figure 8:
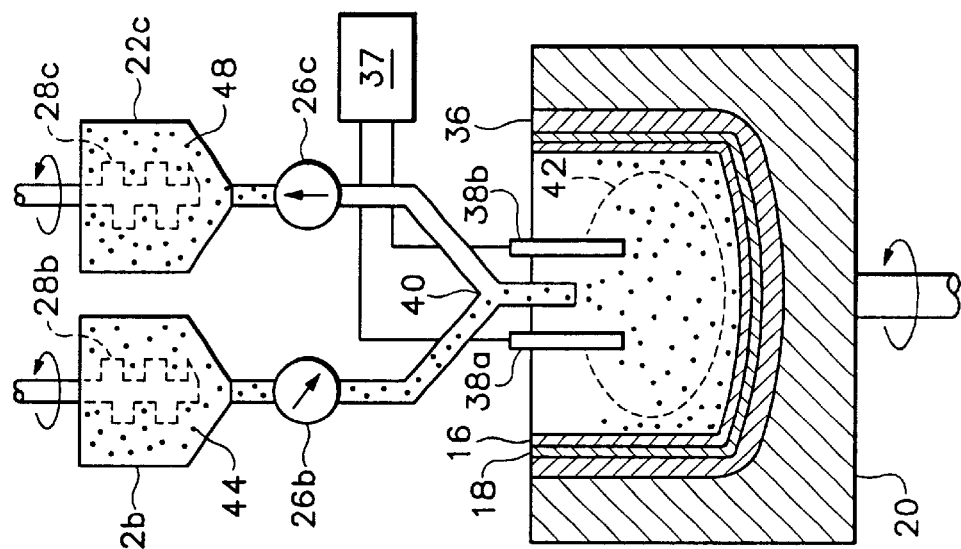
FIGS. 7–8 are diagrams showing a method for making the second embodiment silica glass crucible shown in FIG. 3.
Figure 7:
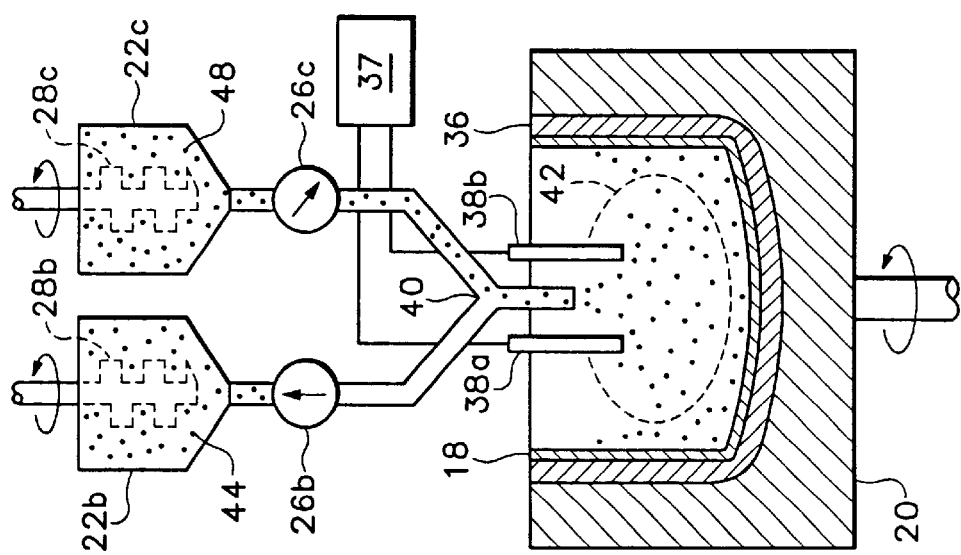

A method for making a crucible having both an inner layer and a transition layer comprises the steps shown in FIGS. 5 and 7–8.

After formation of a bulk grain layer 36, the electrode assembly is positioned within the crucible interior cavity and a transition layer 18 is fused to the partially fused bulk layer 14, in a manner similar to deposition of the inner layer as in FIG. 6.

Transition grain 48 is supplied from the transition grain hopper 22c through flow controlling valve 26c. Hopper stirring blade 28c can be employed similarly to stirring blade 28a.

After deposition of the transition layer 18, the hopper assembly ceases introduction of transition silica grain 48 by closing transition grain flow regulating valve 26c. Inner grain 44, contained in hopper 22b, is then introduced via opening of flow regulating valve 26b. Inner grain 44 is introduced into the region of heat 42, is at least partially melted and deposited as inner layer 16 on transition layer 18.

The thicknesses of transition layer 18 and inner layer 16 are controlled with the help of flow controlling valves 26c,26b, respectively. In the method shown in FIG. 7, the transition layer 18 is a transparent layer prepared between the inner layer 16 (typically also transparent) and the translucent bulk layer 14.

The barium-doped grain can be put on any kind of transparent transition layer. For example, the transition layer 18 can be a pure silica layer, an aluminum-doped layer, or a layer doped with another dopant. In one embodiment, the barium-doped inner layer is deposited on a transparent layer of synthetic silica glass or pure silica glass made from purified natural quartz.

Figure 9:
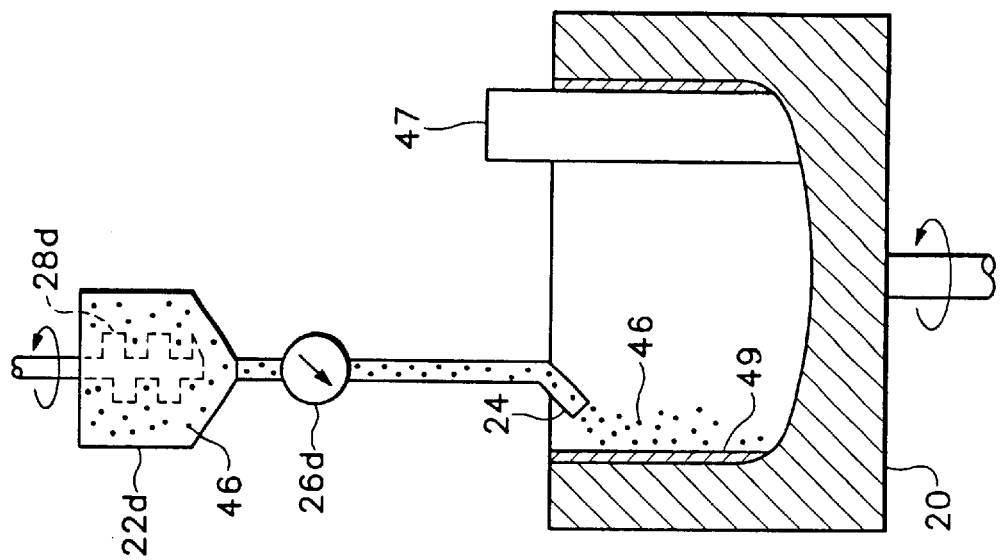
FIG. 9 is a diagram showing the initial step of forming an outer layer, to form the third embodiment silica glass crucible of FIG. 4.

A similar method is used to construct the crucible shown in FIG. 4. An outer grain layer is first formed in a rotating mold 20, as shown in FIG. 9, the thickness of the outer grain layer is controlled using a scraper 47.

An outer grain hopper 22d communicates via a feed tube 24 with the interior of the mold 20. The feed tube 24 can employ a valve 26d to regulate the flow of outer silica grain 46 from the hopper 22d to the interior of the mold. Outer silica grain is flowed thereby into the rotating mold. Rotation of the crucible mold provides sufficient centrifugal force to retain the poured outer silica grain on the inner side surface of the mold as outer grain layer 49

If outer layer is prepared, it is preferable that it be doped with aluminum rather than barium. One reason is that disposal of unfused doped outer silica grain is more convenient if the dopant is aluminum, for environmental concerns.

Fusion is carried out so that unfused grain is preserved between the mold 20 and fused bulk layer 14 (or outer layer 19, if present). Unfused bulk silica grain 30 (and unfused outer grain, if present) is left on the exterior of the crucible. Thus, a rough, bubble-containing outermost surface results. Unfused grain is disposed of in subsequent processing of the crucible, typically by sand-blasting and rinsing with water.

Barium is chosen as the doping element, because a small amount of barium can crystallize the silica glass and if it is dissolved in the silicon melt it will not be transferred to the silicon crystal in large amount.

In the embodiment of the present method thus described, the inner silica grain 44 contains barium via doping. Barium can alternatively be introduced contemporaneously with essentially pure silica grain, i.e., a barium-containing compound can be mixed with essentially pure inner silica grain. For example, barium carbonate ($BaCO_3$) can be placed in the inner grain hopper 22b. A mixing blade 28b can be used to ensure uniform distribution of the barium-containing compound in the inner silica grain. The inner silica grain and barium carbonate mixture then can be flowed into the region of heat as described above. The essentially pure silica grain can be either undoped natural or synthetic silica grain.

In an alternative embodiment of the method, the barium-containing compound can be separately introduced into the heated region contemporaneous with inner silica grain introduction. A separate barium compound hopper can be provided, containing, for example, $BaCO_3$. The valves controlling the inner grain hopper and the barium compound hopper can both be opened, so as to flow concurrently.

Using this alternative method, in which the barium compound is introduced concurrently with but separate from the inner silica grain, the transition silica grain can also be employed as the inner silica grain. For example, the transition silica grain can be flowed to form a transition layer as described above. The transition hopper flow is stopped, and then both transition silica grain and barium compound are flowed simultaneously into the heated region.

In a similar embodiment, the transition layer can be formed as originally described, and then the barium compound flow can be initiated contemporaneous with the still-flowing transition silica grain, to form thereby the inner layer having a barium component therein. The barium compound flow rate can be variable, such that a barium gradient from the inner surface to the transition layer is formed.

In yet another example, the barium-containing compound can be in liquid form, e.g., an aqueous solution of barium hydroxide ($Ba(OH)_2$) or barium chloride ($BaCl_2$). The liquid solution can be introduced into the inner silica grain 44 prior to or contemporaneous with introduction of the inner silica grain into the heated region, or the liquid solution can be introduced directly into the heated region. The latter introduction can be accomplished by an injecting or misting device. The injecting device generally should be positioned adjacent the end of the flow tube proximate the heated region.

The inner layer in the crucible wall is doped with barium in the range of about 5–150 ppm, and most preferably between 15–75 ppm. The inner layer preferably is free of bubbles, as bubbles entrapped within the inner layer may generate fracture-inducing particles as the layer crystallizes. Such particles can dissociate or break away from the inner surface as the bubble expands and as the inner surface erodes or dissolves into the silicon melt. Loose particles can cause loss of the single-crystal structure in the silicon ingot.

The method disclosed above dopes a crucible inner layer with barium, rather than coating the interior surface of the crucible with a barium compound. This improved method, i.e., barium doping, has several merits over conventional coating methods.

The present method enables the concentration of barium in the inner layer to be finely controlled. In one embodiment of the present method described above, the inner layer silica grain is doped with barium prior to its introduction into the mold and fusion. The amount of barium contained in the barium-doped grain can be determined in advance by analysis. The dopant level in the inner layer can thereby be fine-tuned, for example, by mixing doped silica grain and pure silica grain in the hopper.

The doped inner layer thickness can also be precisely controlled by changing inner silica grain flow rate or flow time. No loss of the barium element was observed, e.g., loss due to sublimation. Substantially all of the introduced dopant was found to be fixed within the inner layer.

By doping with barium in the specified range as a crystallization promoter, the thickness of the crystallization in the layer is controlled. Only the region doped with barium crystallizes; regions not doped with barium do not crystallize during a typical CZ-process operation. This characteristic gives a crucible designer greater freedom to tailor the crucible to the needs of the process in which it will be employed.

As the barium is fused in the silica glass, the crucibles can be machined to dimensions, cleaned or etched, and handled with the same procedures as for normal pure silica crucibles; no additional post-manufacture processing or special handling of the crucible is required.

For example, unfused grain remaining on the outside of a conventional crucible is cleaned by sand-blasting, followed by rinsing with water. After cutting the crucible to specified dimensions, it is cleaned by etching with dilute hydrofluoric acid and rinsing with pure water. The crucible is dried in a clean air bath, then bagged and boxed for shipment. A user typically unpacks the crucible and again cleans it before use (by rinsing with water or wiping with alcohol or any other methods as commonly used for pure silica glass crucibles). A crucible constructed according to the present disclosure can be handled as described above.

Figure 10A:
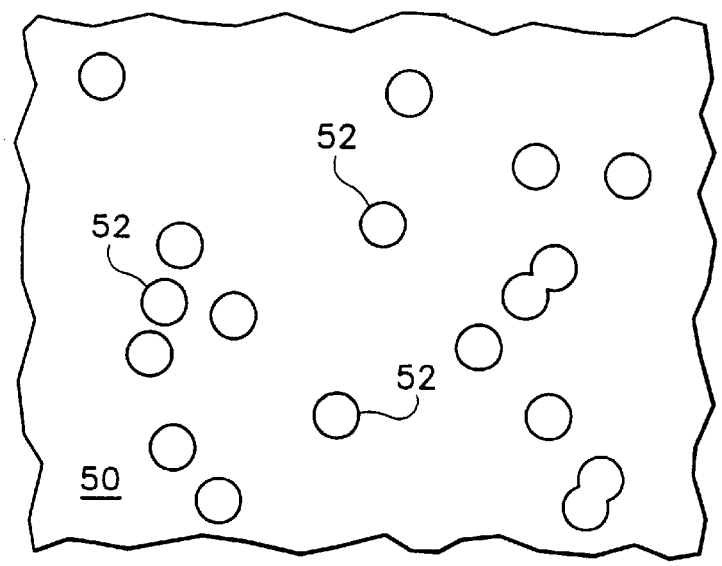
FIGS. 10A–10C are plan views of a prior art crucible inner surface at various stages of a CZ run.

It is known in the ingot manufacturing industry that circular patterns ("rosettes") are observed on the crucible surface contacting the silicon melt. This phenomenon was determined to be a rosette 52 surrounded by crystobalite (FIG. 10A). The center of the rosette has a rough surface that may be covered by a very thin crystobalite layer. Outside of the rosette is the original silica glass surface 50, which has retained its original smoothness.

Figure 10B:
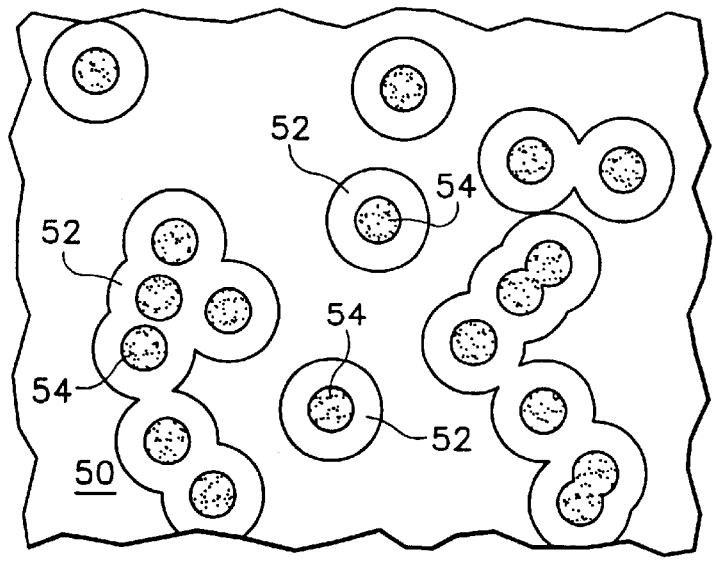
Figure 10C:
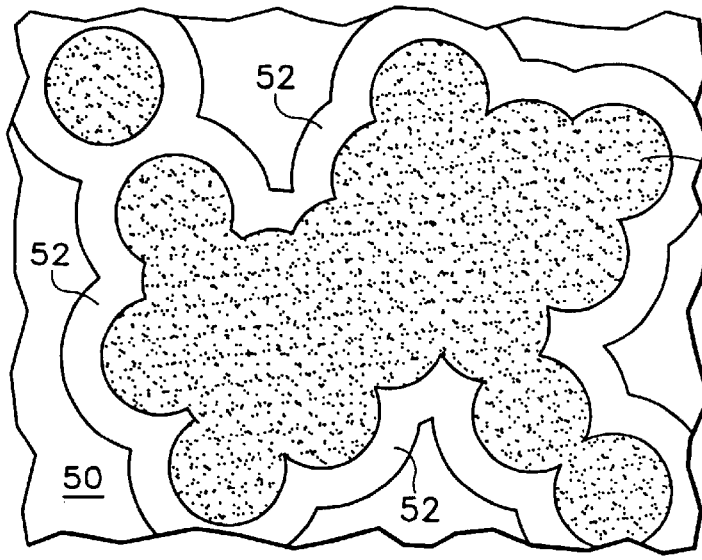

As CZ run time progresses, rosettes 52 grow and the surfaces of the rosette centers 54 become rough (FIG. 10B). Further, the rosettes 52 merge and the rough surface area 54 increases, with a concomitant decrease in the smooth virgin surface 50 (FIG. 10C).

The present crucible suppresses the generation of rosettes, which structures are the initial cause of the roughening of the inner surface. Rosette suppression is accomplished by crystallization of the inner surface of a crucible wall prior to full melt-down of the silicon charge in a CZ process.

Figure 11:
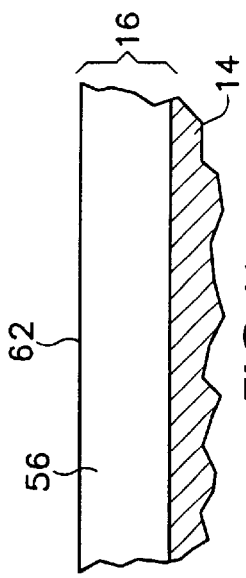
FIG. 11 is an enlarged cross-sectional view of the portion of a crucible constructed according to the present disclosure, in which the inner layer is crystallized.

Regarding these rosettes and concomitant surface roughening, the present disclosure employs barium doping to provide a mode for lengthening the useful life of a crucible suitable for use in a CZ-process. Generation of rosettes can be suppressed by crystallizing the inner layer 16 of a crucible wall 14 (FIG. 11) prior to silicon charge melt-down in a CZ-process. The inner layer undergoes a phase transformation from fused silica glass to crystobalite 56, so that the inner surface 62 retains its smooth surface finish throughout.

In this mode, the inner surface 62 of the crucible is covered with crystobalite 56 before melt-down of the charged silicon. Rosettes are not formed by a reaction between the silicon melt and crystalline silica. Because a rosette is not generated, a rough surface area does not appear and the inner surface remains smooth.

Some silicon ingot manufacturers perform sequential silicon crystal "pulls" using the same crucible. In these uses, a subset of the crucible side portion is alternately covered by the melt, exposed to atmosphere as the melt level drops, then covered again as silicon charge is added to begin another ingot pull. The inner surface of a crucible thus used is subjected to high stress for a longer time period, making more important the inner surface textural integrity.

The barium doping level in the inner layer and the thickness of the inner layer has an effect on the rapidity of crystallization in the layer. Therefore, the depth and amount of barium doping in the inner layer is important to achieve a fully crystallized inner layer.

EXAMPLES

Five crucibles A, B, C, D and E were manufactured according to the present disclosure. As well, crucible P was constructed according to the prior art. These crucibles have similar dimensions, e.g., nominal diameters of 24 inches.

Barium doping levels were varied from 10–50 ppm for crucibles A–E, and inner layer thickness was also varied from 0.2–0.8 mm.

The inner layer 16 of Crucibles A–E were made using a barium-doped inner silica grain. Crucibles A–D were made according to the above-disclosed method, with the inner layer thicknesses and doping levels as follows: crucible A, 0.8 mm layer at 10 ppm; crucible B, 0.5 mm layer at 25 ppm; crucible C, 0.2 mm layer at 50 ppm; and crucible D, 1.0 mm layer at 50 ppm. Crucible E is a comparative embodiment, made with an inner layer of 0.1 mm layer at 50 ppm.

The prior art crucible P was of 24-inch diameter. A 1.0 mm-thick inner layer was formed in its interior using pure natural silica grain instead of barium-doped inner silica grain. This natural silica grain contained trace amounts (<0.1 ppm) of barium and roughly 8 ppm aluminum.

Crucibles A–E and P were used in a 120-hour CZ-process, i.e., 120 hours at the chosen high temperature including melting of the silicon charge. The results of these processes are described below.

Crucibles A–E and P were subjected to a 120-hour CZ-process, after which the inner layer was examined. The smooth inner surface of crucibles A–D were found to consist essentially of crystobalite, with no rosette pattern evident. The crucible inner surface presented a smooth finish.

The 200-mm diameter silicon crystals made using crucibles A–D were also assessed. Dislocations were not observed in the silicon ingots.

Crucible E, in contrast, was observed to have spot-wise crystallization of the inner layer, with surface roughening occurring in the non-devitrified loci. The CZ run using crucible E was terminated after 95 hours, as the silicon crystal experienced loss of structure. It is concluded that the thickness of a barium-doped inner layer should be greater than 0.1 mm for the present crucibles.

Prior art crucible P was started in a similar 120-hour CZ-process. However, at about 80 hours into the process, the nascent silicon ingot incurred a grain boundary flaw that disrupted its crystal structure. This flaw forced termination of the CZ-process and rendered the silicon crystal unsuitable for use in semiconductor manufacture.

Examination of the inner surface of Crucible P revealed that it was roughened and almost totally covered with merged rosettes, with very little of the virgin glassy surface remaining. The rough texture within the rosette rings likely was the cause of the silicon crystal interference.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and sub-combinations of the various elements, features, functions and/or properties disclosed herein.

The invention claimed is:

1. A method for making a silica glass crucible, comprising:
   forming a bulk grain layer on an interior surface of a rotating crucible mold, said bulk grain layer having a bottom portion, a side portion and a bulk grain layer interior surface;
   generating a region of heat in the interior of the mold, wherein the region of heat at least partially fuses said bulk grain layer to form a bulk layer; and
   depositing a barium-containing inner layer on the bulk grain layer interior surface.

2. The method of claim 1, wherein forming a bulk grain layer comprises introducing into the rotating crucible mold bulk silica grain.

3. The method of claim 2, wherein bulk silica grain consists essentially of quartz grain.

4. The method of claim 1, wherein a selected thickness of the inner layer is in the range of 0.2–1.0 mm.

5. The method of claim 1, wherein depositing a barium-containing inner layer comprises introducing into said mold inner silica grain doped with barium, wherein the region of heat at least partially melts said inner silica grain and fuses said at least partially molten inner silica grain to the bulk layer.

6. The method of claim 5, wherein the inner silica grain is doped with barium in the range of 5–150 ppm.

7. The method of claim 5, wherein the inner silica grain is doped with barium in the range of 15–75 ppm.

8. The method of claim 1, wherein depositing a barium-containing inner layer comprises introducing into said mold inner silica grain and barium, and wherein the region of heat at least partially melts said inner silica grain and fuses said at least partially molten inner silica grain to the bulk layer.

9. The method of claim 8, wherein the inner silica grain consists essentially of natural silica grain.

10. The method of claim 8, wherein the inner silica grain consists essentially of synthetic silica grain.

11. The method of claim 8, wherein the barium is a solid compound admixed with the inner silica grain.

12. The method of claim 11, wherein the solid barium compound is admixed with the inner silica grain prior to introducing into said mold inner silica grain and barium.

13. The method of claim 1, further comprising, prior to forming a bulk grain layer:
   forming an outer grain layer on an interior surface of a rotating crucible mold, wherein the region of heat at least partially fuses said outer grain layer to form an outer layer.

14. The method of claim 13, wherein the outer layer is formed substantially on the side portion.

15. The method of claim 13, wherein forming an outer grain layer comprises introducing into the rotating crucible mold outer silica grain.

16. The method of claim 15, wherein the outer silica grain is doped with aluminum in the range of 100–500 ppm.

17. A method for making a silica glass crucible, comprising:
   forming a bulk grain layer on an interior surface of a rotating crucible mold;
   generating a region of heat in the interior of the mold, wherein the region of heat at least partially fuses said bulk grain layer to form a bulk layer;
   depositing a transition layer on the bulk grain layer; and
   depositing a barium-containing inner layer on the transition layer.

18. The method of claim 17, wherein forming a bulk grain layer comprises introducing into a rotating crucible mold bulk silica grain.

19. The method of claim 18, wherein the bulk silica grain consists essentially of quartz grain.

20. The method of claim 17, wherein depositing a transition layer comprises introducing into a rotating crucible mold transition silica grain, wherein the region of heat at least partially melts said transition silica grain and fuses said at least partially molten transition silica grain to the bulk layer to form a transition layer.

21. The method of claim 20, wherein the transition silica grain consists essentially of pure natural silica grain.

22. The method of claim 20, wherein the transition silica grain consists essentially of pure synthetic silica grain.

23. The method of claim 20, wherein the transition silica grain is doped with a metal.

24. The method of claim 23, wherein the metal is aluminum.

25. The method of claim 17, wherein a selected thickness of the inner layer is in the range of 0.2–1.0 mm.

26. The method of claim 17, wherein depositing a barium-containing inner layer comprises introducing into said mold inner silica grain doped with barium, wherein the region of heat at least partially melts said inner silica grain and fuses said at least partially molten inner silica grain to the bulk layer.

27. The method of claim 26, wherein the inner silica grain is doped with barium in the range of 5–150 ppm.

28. The method of claim 26, wherein the inner silica grain is doped with barium in the range of 15–75 ppm.

29. The method of claim 17, wherein depositing a barium-containing inner layer comprises introducing into said mold inner silica grain and barium, and wherein the region of heat at least partially melts said inner silica grain and fuses said at least partially molten inner silica grain to the bulk layer.

30. The method of claim 29, wherein the inner silica grain consists essentially of natural silica grain.

31. The method of claim 29, wherein the inner silica grain consists essentially of synthetic silica grain.

32. The method of claim 29, wherein the barium is a solid compound admixed with the inner silica grain.

33. The method of claim 32, wherein the solid barium compound is admixed with the inner silica grain prior to introducing into said mold inner silica grain and barium.

34. The method of claim 17, further comprising, prior to forming a bulk grain layer:
   forming an outer grain layer on an interior surface of a rotating crucible mold, wherein the region of heat at least partially fuses said outer grain layer to form an outer layer.

35. The method of claim 34, wherein the outer layer is formed substantially on the side portion.

36. The method of claim 34, wherein forming an outer grain layer comprises introducing into the rotating crucible mold outer silica grain.

37. The method of claim 36, wherein the outer silica grain is doped with aluminum in the range of 100–500 ppm.

* * * * *